United States Patent
Kawasaki et al.

[11] Patent Number: 5,853,812
[45] Date of Patent: Dec. 29, 1998

[54] METHOD AND APPARATUS FOR PROCESSING SUBSTRATES

[75] Inventors: Tetsu Kawasaki, Yamanashi-ken; Kimio Motoda, Kumamoto, both of Japan

[73] Assignee: Tokyo Electron Limited, Tokyo, Japan

[21] Appl. No.: 907,419

[22] Filed: Aug. 7, 1997

[30] Foreign Application Priority Data

Aug. 30, 1996 [JP] Japan .................................. 8-249227

[51] Int. Cl.⁶ .............................. B05D 1/02; B05B 3/00; B05B 1/00
[52] U.S. Cl. ..................... 427/421; 427/240; 427/420; 427/424; 118/302; 118/321; 118/323
[58] Field of Search .................................. 118/302, 321, 118/323; 427/240, 420, 421, 424

[56] References Cited

U.S. PATENT DOCUMENTS

| | | | |
|---|---|---|---|
| 2,899,929 | 8/1959 | Monroe | 118/302 |
| 3,635,054 | 1/1972 | Amidon, Jr. | 68/43 |
| 3,797,453 | 3/1974 | Rizzo | 118/69 |
| 3,989,569 | 11/1976 | Newman | 156/234 |
| 4,244,200 | 1/1981 | Sando et al. | 68/202 |
| 4,387,002 | 6/1983 | Knecht | 156/578 |
| 4,416,213 | 11/1983 | Sakiya | 118/52 |
| 4,530,306 | 7/1985 | Hovekamp | 118/669 |
| 5,002,008 | 3/1991 | Ushijima et al. | 118/313 |

FOREIGN PATENT DOCUMENTS

| | | |
|---|---|---|
| 4-124812 | 4/1992 | Japan . |
| 4-200768 | 7/1992 | Japan . |
| 5-55133 | 3/1993 | Japan . |
| 7-326554 | 12/1995 | Japan . |

*Primary Examiner*—Shrive Beck
*Assistant Examiner*—Michael Barr
*Attorney, Agent, or Firm*—Oblon, Spivak, McClelland, Maier & Neustadt, P.C.

[57] ABSTRACT

A method for processing substrates, comprising the steps of (a) disposing a substrate on a supporting table, followed by preparing a nozzle and a contact adjusting member in a waiting position apart from the substrate disposed on the supporting table and further preparing removing means in a position intermediate between the waiting position and an operating position, (b) allowing a solvent to be attached to the contact adjusting member in the waiting position and moving the contact adjusting member relative to the nozzle so as to bring the process solution present in the solution discharge port of the nozzle into contact with the solvent attached to the contact adjusting member and, thus, to adjust the condition of the process solution present in the solution discharge port of the nozzle, (c) moving the nozzle from the waiting position to an operating position through the removing means so as to allow the process solution spurted from the nozzle to be moved into the removing means, and (d) moving the substrate and the nozzle relative to each other while allowing the process solution to be spurted from the nozzle so as to form a film of the process solution on the substrate.

14 Claims, 6 Drawing Sheets

METHOD AND APPARATUS FOR PROCESSING SUBSTRATES

BACKGROUND OF THE INVENTION

The present invention relates to a method and apparatus for processing substrates, in which a substrate such as a semiconductor wafer is coated with a process solution such as a resist solution and then, if necessary, with a process solution such as a developing solution.

It is seriously requested in this technical field to establish a technology for achieving an efficient processing of a substrate such as a semiconductor wafer with a small amount of a process solution such that a process solution can be supplied to the substrate promptly in a short time and that the substrate can be processed without receiving an impact and without generating bubbles.

An apparatus intended to meet the particular request is disclosed in, for example, Japanese Patent Disclosure (Kokai) No. 5-55133. The apparatus disclosed in this prior art comprises a nozzle including a large number of fine holes made through the bottom portion of a rectangular solution container. In this prior art, a developing solution is supplied through these fine holes onto a semiconductor wafer.

Another apparatus is disclosed in, for example, Japanese Patent Disclosure No. 4-124812. In this apparatus, a process solution is supplied from a solution reservoir formed within a nozzle into a band-like discharge port through a plurality of fine tubes so as to permit the process solution to be spurted in a band shape from the discharge port.

Further, still another apparatus is disclosed in, for example, Japanese Patent Disclosure No. 7-326554. In this apparatus, a small amount of a developing solution is supplied from a nozzle onto a semiconductor wafer, which is held stationary right under the nozzle, to form a solution film on the wafer surface. Then, the developing solution is further supplied from the nozzle in an amount sufficient for increasing the thickness of the solution film formed on the wafer surface to reach a desired value. At the same time, the nozzle and/or the wafer are moved relative to each other to form a solution film of a desired thickness on the wafer surface.

In any of the prior arts exemplified above, the nozzle in its waiting position is moved to an operating position for forming a solution film on a wafer surface. When the nozzle is positioned in its waiting position, the discharge port of the nozzle is brought to a position close to the outer circumferential surface of a roller which is kept rotated. Under this condition, the developing solution spurted from the discharge port of the nozzle is brought into contact with the outer circumferential surface of the roller so as to adjust the spurting condition in preparation for the processing operation. Then, the nozzle is moved from its waiting position to the operating position. Also, the nozzle and/or the wafer are moved relative to each other for forming a film of the developing solution on the wafer surface.

However, the thickness of the solution film formed on the wafer surface by the conventional method is unsteady in the initial period of the coating operation. Specifically, as shown in FIG. 1, the film thickness is gradually stabilized to reach a desired value (zero level in FIG. 1) at a coating point about 40 mm to 50 mm apart from the starting point of the coating operation. It should be noted in this connection that it takes time for the nozzle to be moved from the waiting position to the operating position, making it impossible to maintain constant the condition of the developing solution during movement of the nozzle. As a result, the amount of the developing solution attached to or staying in the discharge port of the nozzle is rendered excessively large or small, leading to the unsteady coating operation in the initial period pointed out above.

BRIEF SUMMARY OF THE INVENTION

An object of the present invention is to provide a method and apparatus for processing substrates, in which the condition of the process solution present in the discharge port of the nozzle, which is adjusted at the waiting position, is kept unchanged during movement of the nozzle from the waiting position to the operating position so as to overcome the above-noted difficulties inherent in the prior art. The term "condition of the process solution" noted above denotes the physical and chemical states of the process solution such as the discharge rate, viscosity, concentration, temperature and bubble content. The term "operating position" denotes the position at which the process solution is spurted from the nozzle onto a peripheral portion of the substrate disposed on a supporting table. Further, the term "waiting position" denotes a position apart from the supporting table, at which the condition of the process solution present at the discharge port of the nozzle is adjusted.

As a result of an extensive research which has been made in an attempt to achieve the above-noted object, the present inventors have arrived at a method and apparatus for processing substrates, in which a removing means having the process solution from the discharge port of the nozzle attached thereto temporarily is interposed between the waiting position and the operating position of the nozzle so as to keep unchanged the condition of the process solution, which is adjusted at the waiting position, during movement of the nozzle from the waiting position to the operating position, thereby to achieve the present invention.

According to a first aspect of the present invention, there is provided a method for processing substrates, comprising the steps of:

(a) disposing a substrate on a supporting table such that the peripheral portion of the substrate is located in an operating position, followed by preparing a nozzle and a contact adjusting member in a waiting position apart from the substrate disposed on the supporting table and further preparing removing means in a position intermediate between the waiting position and an operating position;

(b) allowing a solvent to be attached to the contact adjusting member in the waiting position and moving the contact adjusting member relative to the nozzle so as to bring the process solution present in the solution discharge port of the nozzle into contact with the solvent attached to the contact adjusting member and, thus, to adjust the condition of the process solution present in the solution discharge port of the nozzle;

(c) moving the nozzle from the waiting position to an operating position through the removing means so as to allow the process solution spurted from the nozzle to be moved into the removing means; and (d) moving the substrate and the nozzle relative to each other while allowing the process solution to be spurted from the nozzle so as to form a film of the process solution on the substrate.

According to a second aspect of the present invention, there is provided a method for processing substrates, comprising the steps of:

(a) disposing a substrate on a supporting table such that the peripheral portion of the substrate is located in an operating position, followed by bringing a nozzle to a waiting position apart from the substrate disposed on the supporting table and further preparing an endless belt stretched between the waiting position and operating position of the nozzle such that an upper part of the belt extends along the locus of movement of the discharge port of the nozzle, and a tank housing a solvent, a lower part of the endless belt being dipped in the solvent;

(b) allowing a solvent to be attached to the endless belt in the waiting position and moving the endless belt relative to the nozzle so as to bring the process solution present in the solution discharge port of the nozzle into contact with the solvent attached to the endless belt and, thus, to adjust the condition of the process solution present in the solution discharge port of the nozzle;

(c) moving the nozzle from the waiting position to an operating position through an upper part of the endless belt so as to allow the process solution spurted from the nozzle to be moved onto the upper part of the endless belt; and (d) moving the substrate and the nozzle relative to each other while allowing the process solution to be spurted from the nozzle so as to form a film of the process solution on the substrate.

According to a third aspect of the present invention, there is provided an apparatus for processing substrates, comprising:

a supporting table on which a substrate is disposed such that the peripheral portion of the substrate is located in an operating position;

a nozzle for supplying a process solution to the substrate disposed on the supporting table;

nozzle moving means for moving the nozzle between a waiting position apart from the substrate disposed on the supporting table and the operating position;

a contact adjusting member having a solvent attached thereto in the waiting position and being moved relative to the nozzle such that the process solution present in the solution discharge port of the nozzle is brought into contact with the attached solvent so as to permit the process solution to be spurted from the nozzle, thereby adjusting the condition of the process solution present in the solution discharge port of the nozzle; and removing means mounted between the waiting position and the operating position for removing the process solution present in the solution discharge port of the nozzle.

According to a fourth aspect of the present invention, there is provided an apparatus for processing substrates, comprising:

a supporting table on which a substrate is disposed such that the peripheral portion of the substrate is located in an operating position;

a nozzle for supplying a process solution to the substrate disposed on the supporting table;

nozzle moving means for moving the nozzle between a waiting position apart from the substrate disposed on the supporting table and the operating position;

an endless belt stretched between the waiting position and operating position of the nozzle such that an upper part of the belt extends along the locus of movement of the discharge port of the nozzle, the endless belt being moved relative to the nozzle such that a solvent is attached to the belt in the waiting position of the nozzle and the attached solvent is brought into contact with the process solution present in the discharge port of the nozzle so as to permit the process solution to be discharged and,. thus, to adjust the condition of the process solution present in the discharge port of the nozzle and, at the same time, to remove the process solution present in the discharge port of the nozzle; and a tank housing a solvent, a lower part of the endless belt being dipped in the solvent.

In the present invention, the condition of the process solution spurted from the discharge port of the nozzle is sufficiently adjusted in advance in the waiting position. In addition, the adjusted condition is kept unchanged by a removing means such as a dummy plate or an endless belt while the nozzle is moved from the waiting position to the operating position. It follows that, where the nozzle moved to the operating position is scanned for coating a substrate with the process solution, the thickness of the film of the process solution formed on the substrate is rendered uniform over the entire region including the peripheral portion at which the coating is started.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Let us describe some embodiments of the method and apparatus of the present invention for processing substrates with reference to the accompanying drawings. The embodiments described herein cover the cases where semiconductor wafers are coated with a developing solution.

(First Embodiment)

Figure 1:
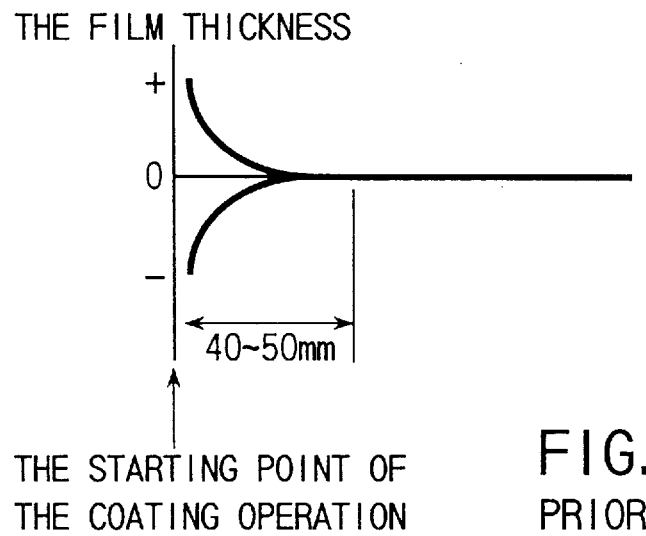
FIG. 1 is a graph schematically showing how the thickness of a coating film formed on a substrate is changed in the initial coating period of a developing solution in respect of a conventional substrate processing apparatus.
Figure 2:
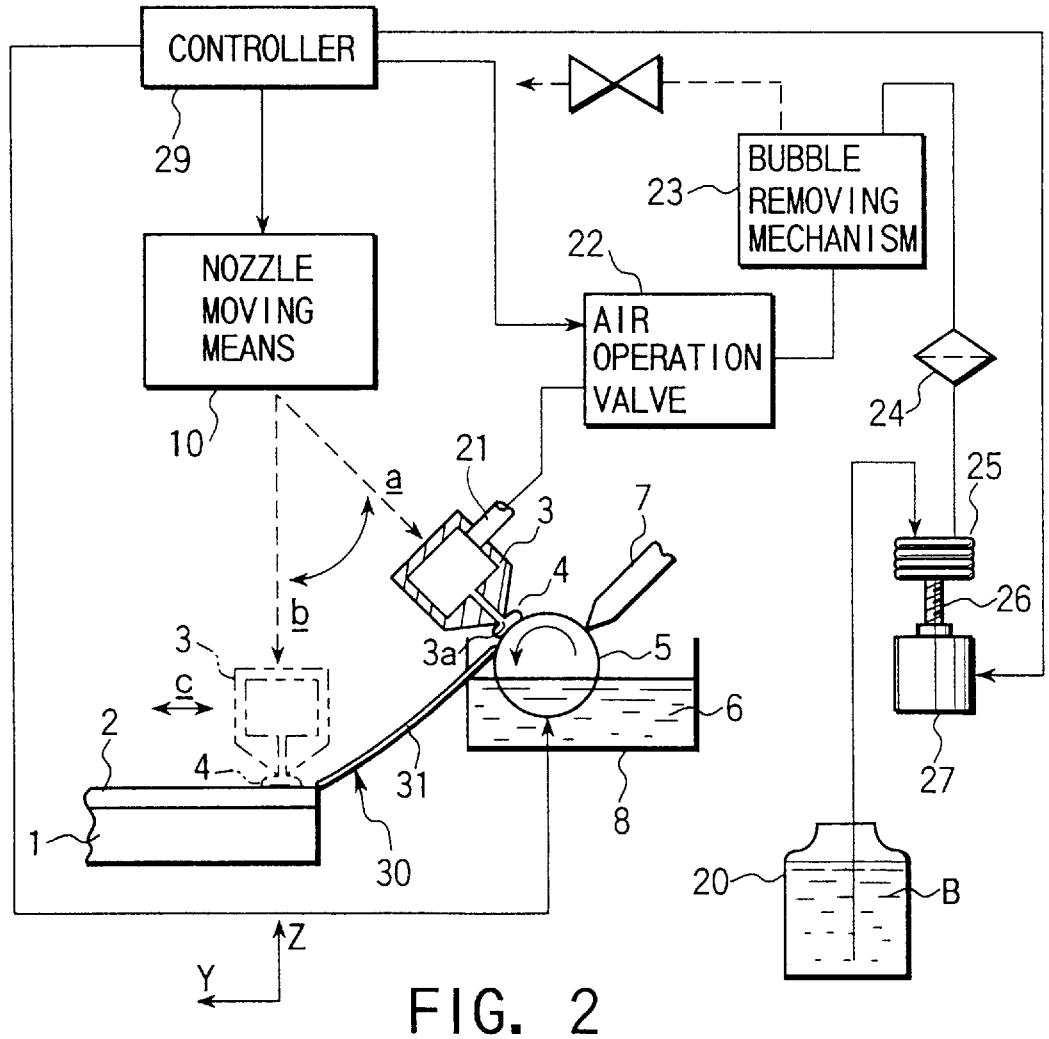
FIG. 2 is a block diagram schematically showing a substrate processing apparatus according to a first embodiment of the present invention.
Figure 3:
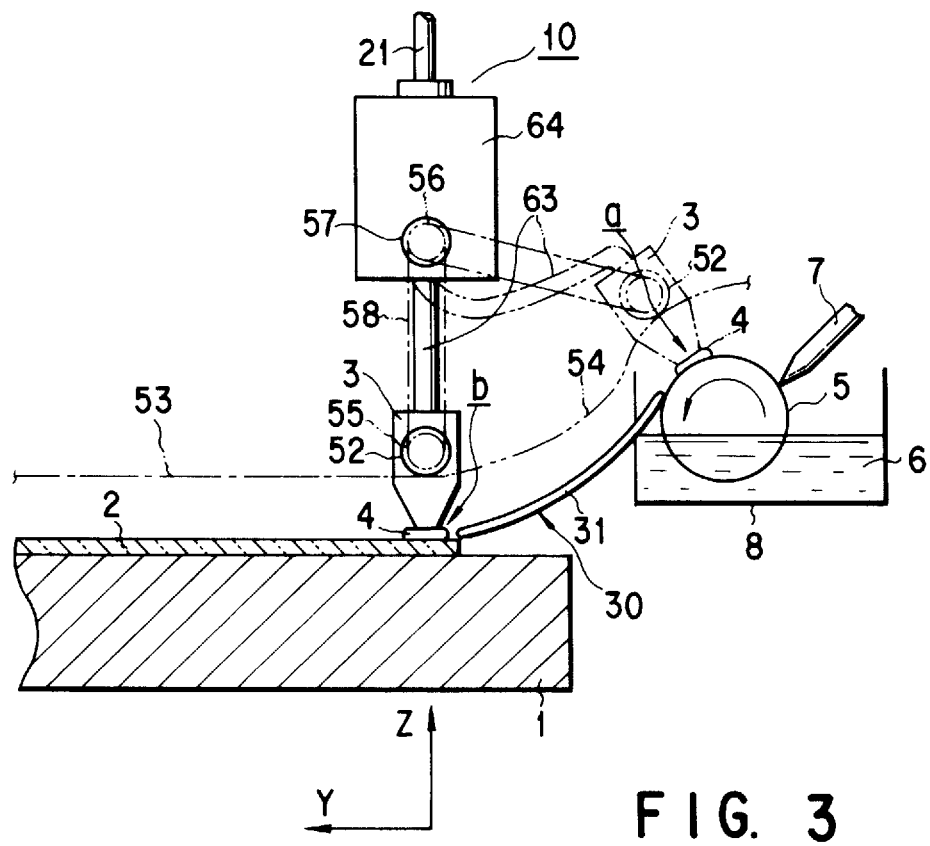
FIG. 3 shows a nozzle moving means, as seen in an X-axis direction, mounted in the apparatus shown in FIG. 2.
Figure 4:
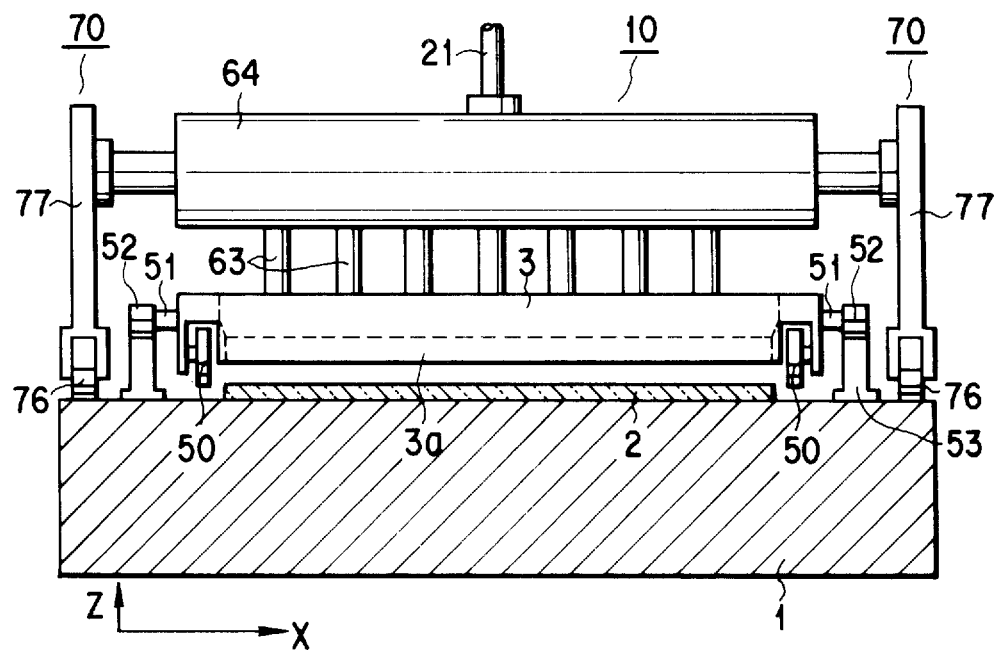
FIG. 4 shows a nozzle moving means, as seen in a Y-axis direction, mounted in the apparatus shown in FIG. 2.

As shown in FIG. 2, the substrate processing apparatus of the present invention comprises a supporting table 1 for horizontally supporting a semiconductor wafer 2 by means of vacuum suction, a nozzle 3 for supplying a developing solution 4 onto the wafer 2 supported by the supporting table 1, a roller 5, a nozzle moving means 10, a developing solution tank 20, and a controller 29. As shown in FIG. 3, the nozzle moving means 10 includes moving mechanisms 56, 57 for moving the nozzle 3 between a waiting position a and an operating position b. The nozzle moving means 10 also includes a scan mechanism 70 for scanning the nozzle 3, as shown in FIG. 4. The operation of the roller 5 and the nozzle moving means 10 is controlled by the controller 29.

The nozzle 3 communicates with the developing solution tank 20 through a tube 21 to form a developing solution supply circuit. Mounted to the circuit are an air operation valve 22, a bubble removing mechanism 23, a filter 24 and a bellows pump 25 in the order mentioned. The bubble removing mechanism 23 permits removing bubbles from a developing solution B supplied from the tank 20. The bellows pump 25, which is used as a flow rate control means, is driven by its driving section such that a predetermined amount of the developing solution B is supplied through the nozzle 3 onto a central portion of the wafer 2.

The driving time of the bellows pump 25 is automatically set by the controller 29 in accordance with a program set in advance. The controller 29 also serves to automatically control the on-off operation of the air operation valve 22 based on the program set in advance. The particular construction of the present invention permits the bellows pump 25 to supply the developing solution B to the nozzle 3 in a desired amount. In other words, the developing solution B is not supplied excessively to the nozzle 3, leading to a smaller amount of the developing solution B actually supplied to the nozzle 3 than in the past. The driving section of the bellows pump 25 includes an externally threaded rod 26 having one end mounted to one end of the bellows, a nut (not shown) engaged with the threaded rod 26, and a servo motor or stepping motor 27 serving to rotate the nut.

In the developing solution supply circuit of the construction described above, the spurting time of a developing solution 4 from the nozzle 3 is controlled by the driving time of the stepping motor 27 of the bellows pump 25. Also, the discharge amount of the developing solution 4 is determined by the driving mode such as the driving time and the driving speed of the bellows pump 25 and the on-off operation of the air operation valve 22 for opening/closing the developing solution supply circuit.

A roller 5 rotatable in one direction is arranged in the waiting position a. As shown in the drawings, the lower portion of the roller 5 is dipped in water (solvent) 6 housed in a tank 8. When the coating operation is started, a discharge port 3a of the nozzle 3 located in the waiting position a is positioned very close to the circumferential outer surface of the roller 5, with the result that the condition of the developing solution 4 discharged from the discharge port 3a of the nozzle 3 is adjusted. It should be noted that the solution 4 attached to the outer circumferential surface of the roller 5 is mostly removed by the solvent 6, and the residual solution 4 is removed by a wiper 7 which is slidably in contact with the circumferential surface of the roller 5.

Then, the nozzle 3 is moved from the waiting position a to the operating position b by the moving mechanisms 56, 57 of the nozzle moving means 10. A removing means 30 is mounted between the waiting position a and the operating position b in order to prevent the condition of the developing solution 4 discharged from the discharge port 3a of the nozzle 3 from being changed during the above-noted movement of the nozzle 3. As seen from the drawings, the developing solution 4 discharged from the nozzle discharge port 3a is temporarily attached to the removing means 30 for achieving the particular object.

In the apparatus shown in FIG. 2, the nozzle 3 is swung by the moving mechanisms 56, 57. Therefore, a dummy plate 31 bent along the locus of the swinging motion of the discharge port 3a at the tip of the nozzle 3 is mounted as the removing means 30 between the waiting position a and the operating position b. Since the developing solution 4 discharged from the discharge port 3a continues to be removed by the dummy plate 31 during the movement of the nozzle 3 from the waiting position a to the operating position b, the condition of the process solution (developing solution) adjusted at the waiting position a is kept unchanged until the nozzle 3 is moved to the operating position b.

During movement of the nozzle 3 from the waiting position a to the operating position b, the nozzle discharge port 3a is positioned close to the dummy plate 31 so as to allow the developing solution discharged from the nozzle discharge port 3a to be moved onto the dummy plate 31. As a result, the properties and environment of the developing solution present in the nozzle discharge port 3a are stabilized. It follows that, where the developing solution 4 is supplied onto the wafer 2 by moving the nozzle 3 and/or the wafer 2 relative to each other in the Y-axis direction, a coating film of the developing solution is formed in a uniform thickness on the wafer 2, starting with the initial coating position at the periphery of the wafer 2.

Incidentally, the nozzle moving mechanisms 56, 57, i.e., a motor 56 and a driving pulley 57, which are shown in FIG. 3, and a nozzle scanning mechanism 70 shown in FIG. 4 can be used as the nozzle moving means 10.

As shown in FIG. 3, the motor 56 is arranged in a side portion of a solution reservoir 64, and the driving pulley 57 is fixed to the rotating shaft of the motor 56. The solution reservoir 64 is connected to the tank 20 via a developing solution supply tube 21. Also, a tube 63 is connected to the solution reservoir 64 for supplying the developing solution from the reservoir 64 to the nozzle 3. The tube 63 is deformable such that the tube 63 can be elongated or bent upon receipt of force of a predetermined magnitude or more. It follows that the nozzle 3 is movable in a direction perpendicular to the coating surface of the wafer 2.

Further, a guide roller 52 is mounted in a side portion of the nozzle 3. A driven pulley 55 is fixed to the shaft of the guide roller 52. Further, a belt 58 is stretched between these driving pulley 57 and driven pulley 55. It follows that the nozzle 3 is moved to the operating position b or the waiting position a if the motor 56 is driven when the nozzle 3 is located in a switching portion 54.

To be more specific, the driving pulley 57 is rotated in response to the driving of the motor 56. Then, the driven pulley 55 is rotated in response to the rotation of the driving pulley 57. In accordance with rotation of the driven pulley 55, the guide roller 52 is allowed to run along the switching portion 54 of a guide rail 53. As a result, the nozzle 3 is moved from the waiting position a to the operating position b, or in the opposite direction, while allowing the developing solution 4 discharged from the discharge port 3a to be attached to the bent dummy plate 31 extending along the switching portion 54 of the guide rail 53.

FIG. 4 shows a scanning mechanism 70 for moving the nozzle 3 in parallel with the wafer 2 facing the nozzle 3. The scanning mechanism 70 comprises a pair of supporting rods 77 arranged at both end portions of the solution reservoir 64 for supporting the reservoir 64 and moving rollers 76 each mounted at the lower end of the supporting rod 77 for allowing the supporting rods 77 to be movable in a direction parallel with that surface of the supporting table 1 which holds the wafer 2.

Rollers 50 running on the supporting table 1 are arranged at both end portions of the nozzle 3. These rollers 50 act as a clearance retaining means.

The switching means for the switching of the nozzle between the waiting position and the operating position at the peripheral portion of the wafer 2 held by the supporting table 1 was already described in conjunction with FIG. 3. The particular switching means comprises a guide roller 52 mounted to the nozzle 3 and the guide rail 53, which is stationary. A horizontal shaft 51 (FIG. 4) is mounted to the nozzle 3 in parallel to the wafer 2. The guide roller 52 is mounted to the end portion of the horizontal shaft 51. Further, the guide rail 53 is mounted to that surface of the supporting table 1 which serves to hold the wafer 2.

If the nozzle 3 is moved from the waiting position a to the operating position b, the guide roller 52 is moved away from the guide rail 53. Also, the rollers 50 at the ends of the nozzle 3 are caused to land on the supporting table 1. While the nozzle 3 is moved in the Y-axis direction, the rollers 50 are allowed to run on the supporting table 1, with the result that the clearance between the wafer 2 and the discharge port 3a of the nozzle 3 is maintained constant. In this fashion, the nozzle 3 is moved in parallel to the wafer 2 while spurting the developing solution 4.

(Substrate Processing Method)

Figure 5:
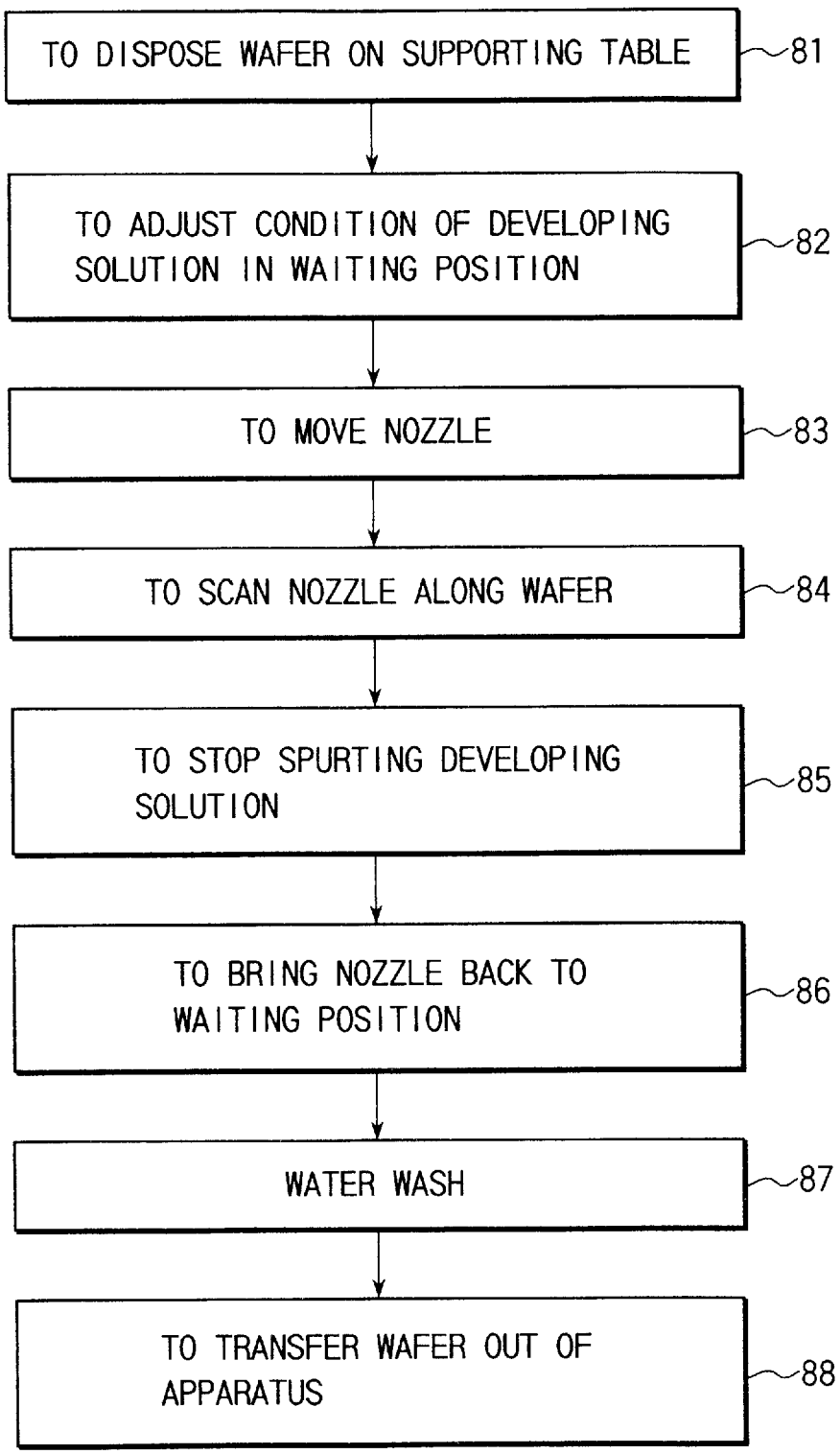
FIG. 5 is a flow chart showing a substrate processing method according to the first embodiment of the present invention.

Let us describe how the substrate processing apparatus described above is used for applying a developing treatment to the wafer 2, with reference to FIG. 5.

(I) As shown in FIG. 2, the wafer 2 disposed on the supporting table 1 is held by vacuum suction (step 81).

(II) The lower portion of the roller 5 is dipped in water 6 (solvent) housed in the tank 8 to allow the solvent to be attached to the roller 5. Also, the roller 5 is rotated, and the developing solution 4 present in the discharge port 3a of the nozzle 3 in the waiting position a is brought into contact with the solvent attached to the roller 5 so as to adjust the condition of the developing solution 4 present in the discharge port 3a of the nozzle 3 (step 82).

(III) The nozzle 3 is moved by the nozzle moving mechanisms 56, 57 from the waiting position a to the operating position b at a peripheral portion of the wafer 2 via the removing means 30 so as to bring the developing solution 4 spurted from the nozzle 3 into contact with the removing means 30 (step 83).

(IV) The nozzle 3, which is spurting the developing solution 4, is scanned by the nozzle scanning mechanism 70 along the wafer 2 so as to form a film of the developing solution on the wafer 2 (step 84).

(V) After scanning of the nozzle 3 over the entire surface of the wafer 2, spurting of the developing solution 4 from the nozzle 3 is stopped (step 85).

(VI) The nozzle 3 is brought back to the waiting position a (step 86).

(VII) Pure water is sprayed against the wafer 2 so as to wash away the developing solution (step 87).

(VIII) The wafer 2 is transferred out of the developing apparatus (step 88).

(Modification)

Figure 6:
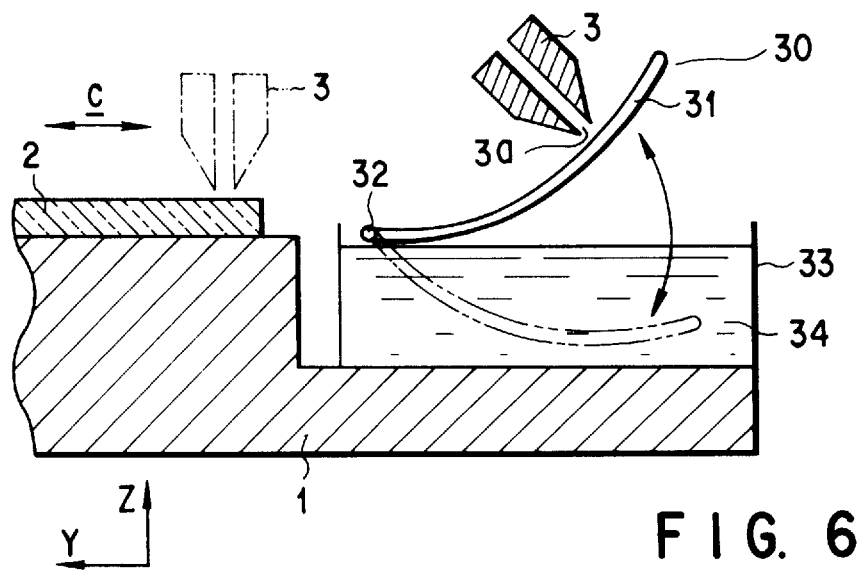
FIG. 6 is a cross sectional view schematically showing a substrate processing apparatus according to a modification of the first embodiment of the present invention.
Figure 7:
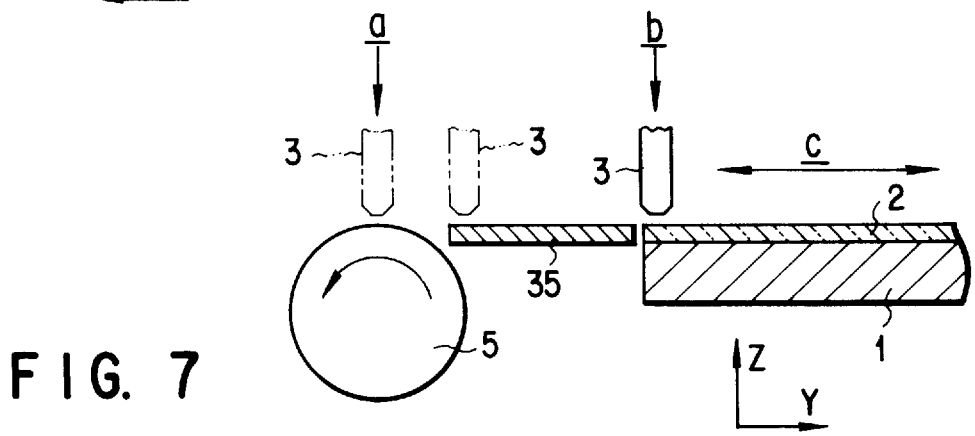
FIG. 7 is a cross sectional view schematically showing a substrate processing apparatus according to another modification of the first embodiment of the present invention.

The substrate processing method and apparatus according to the first embodiment of the present invention include modifications in the removing means 30 shown in FIGS. 6 and 7. In the modification shown in FIG. 6, the dummy plate 31 is swingably pivoted to a pivotal shaft 32 such that the dummy plate 31 in its lowest position is dipped in water 34 housed in the tank 33 so as to wash away the developing solution 4 attached to the dummy plate 31. The operation of the dummy plate 31 is controlled by the controller 29.

In the modification in FIG. 7, a flat dummy plate 35, which is arranged intermediate between the waiting position a and the operating position b, is used as the removing means 30. Incidentally, it is also possible to use an endless belt 40 (see, for example, FIG. 8) as the removing means 30.

(Second Embodiment)

The substrate processing method and apparatus of the present invention can also be used for the coating of a substrate with a resist solution. In this case, a thinner is used as a solvent and, thus, a careful attention should be paid not to have the substrate adversely affected by, particularly, the solvent vapor coming from the solvent tank.

Figure 8:
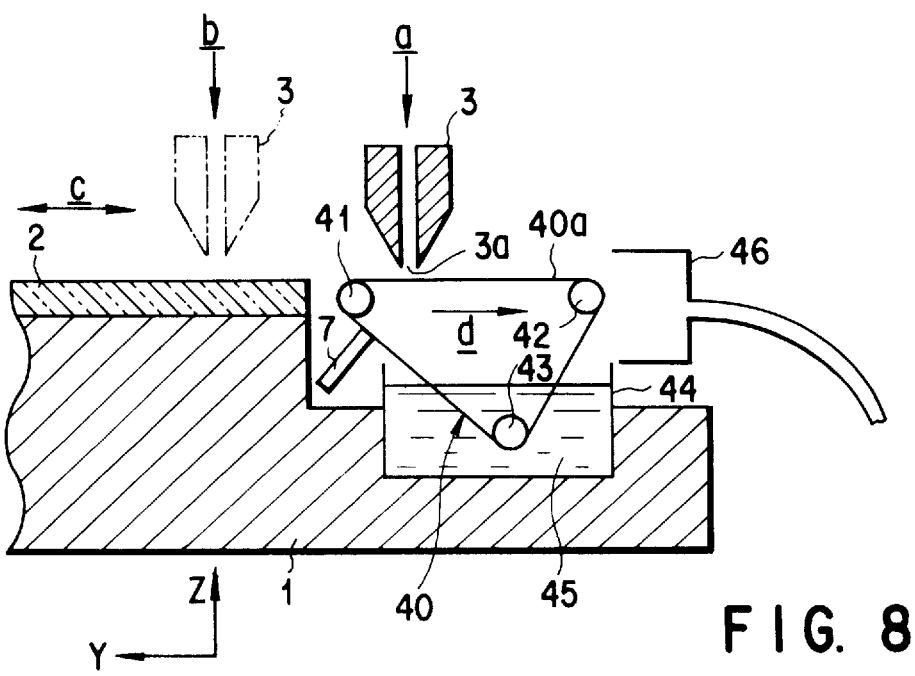
FIG. 8 is a cross sectional view schematically showing a substrate processing apparatus according to a second embodiment of the present invention.

FIG. 8 covers the case where the endless belt 40 is arranged as the removing means 30 intermediate between the waiting position a and the operating position b. The endless belt 40 is stretched about a driven roller 41 mounted in the vicinity of the peripheral portion of the wafer 2 in the operating position b, a driving roller 42 positioned substantially flush with the driven roller 41 and more apart from the operating position b than the roller 41, and another driven roller 43 positioned below the rollers 41, 42 such that the endless belt 40 stretched about these rollers 41, 42 and 43 is substantially shaped like a reversed triangle. The operation of the driving roller 42 is controlled by the controller 29. As apparent from the drawing, a running region 40a of the endless belt 40 which is positioned between the rollers 41 and 42 extends along the locus of the discharge port 3a of the nozzle 3. In this embodiment, the running region 40a is flush with the upper surface of the wafer 2. Also, the endless belt 40 runs in the running region 40a in a direction denoted by an arrow d, which is opposite to the moving direction of the nozzle 3 from the waiting position a to the operating position b. It follows that, while the nozzle 3 stays in the waiting position a or is being moved toward the operating position b in preparation for the coating operation, the resist solution present in the discharge port 3a of the nozzle 3 is wiped off by the endless belt 40 so as to adjust the condition of the resist solution which is to be spurted through the discharge port 3a onto the wafer 2 during the coating operation.

On the other hand, that region of the endless belt 40 which is running about the driven roller 43 dipped in a thinner 45 housed in a tank 44 is naturally dipped in the thinner 45. The resist solution attached to the endless belt 40 is removed from the belt 40 when the belt 40 passes through the thinner 45. Further, a residual resist solution is removed by the wiper 7 mounted between the rollers 43 and 41.

What should also be noted is that, in order to avoid an adverse effect given by the solvent vapor to the coating of the wafer 2, an exhaust duct 46 is arranged in an upper rear portion of the tank 44. Further, the roller 43 arranged within the tank 44 is positioned away from the wafer 2.

The apparatus shown in FIG. 8 produces a merit that the endless belt 40 permits adjusting at the waiting position a the condition of the resist solution spurted from the nozzle. An additional merit is that the condition of the resist solution adjusted at the waiting position a can be kept unchanged during movement of the nozzle 3 from the waiting position a to the operating position b. Since the endless belt 40 acts both as a contact adjusting member and as a removing means, the number of parts used and the manufacturing cost can be lowered.

(Modification)

Figure 9:
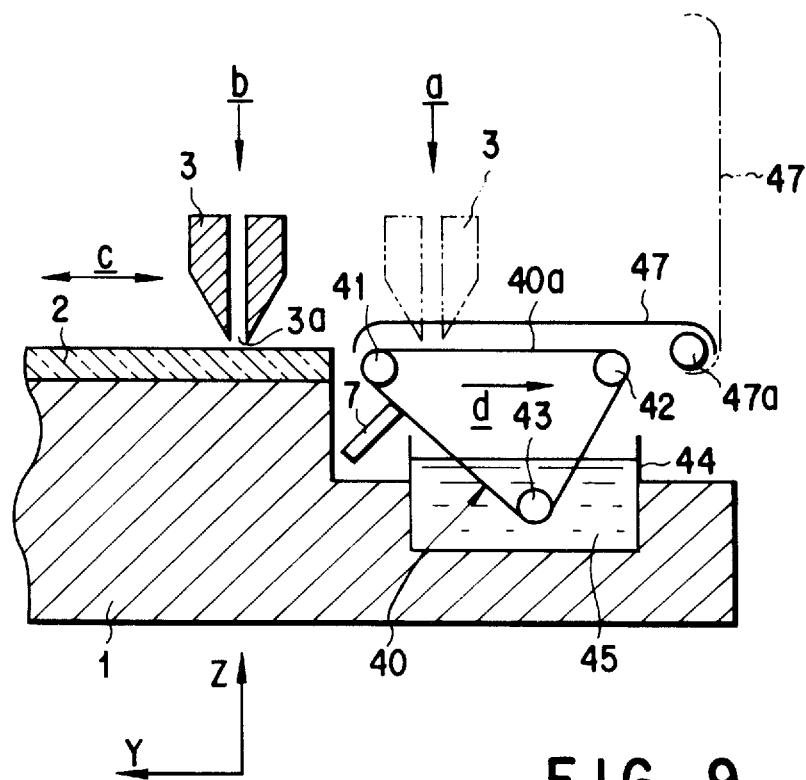
FIG. 9 is a cross sectional view schematically showing a substrate processing apparatus according to a modification of the second embodiment of the present invention.
Figure 10:
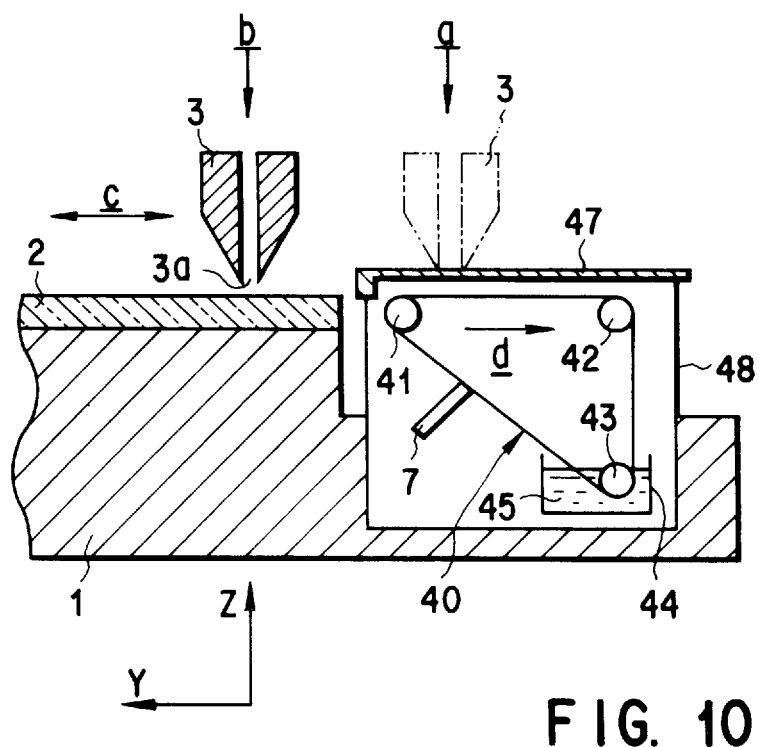
FIG. 10 is a cross sectional view schematically showing a substrate processing apparatus according to another modification of the second embodiment of the present invention.

The substrate processing method and apparatus according to the second embodiment of the present invention include modifications shown in FIGS. 9 and 10. In the modification shown in FIG. 9, a lid 47 is arranged above the tank 44 so as to prevent the vapor of the thinner 45 from giving a detrimental effect to the resist coating on the wafer 2. The lid 47 is swingably supported by a pivotal shaft 47a such that, when the nozzle 3 is in the waiting position a, the lid 47 is opened as denoted by a two dots-dash line and, when the nozzle 3 is not in the waiting position a, the lid 47 is closed as denoted by a solid line. The operation of the lid 47 is controlled by the controller 29.

On the other hand, in the modification shown in FIG. 10, which is also intended to prevent the vapor of the thinner 45 from adversely affecting the wafer 2, the tank 44 housing the thinner 45 is put in a casing 48. In addition, the tank 44 within the casing 48 is positioned remotest from the wafer 2. As seen from the drawing, a running region remote from the operating position b, i.e., the lowermost region of the roller 43, of the endless belt 40 is dipped in the thinner 45 housed in the tank 44. It should be noted, however, that the belt portion of the roller 41 protrudes toward the operating position b in order to bring the belt 40 to a position close to the peripheral portion of the wafer 2 as much as possible.

Incidentally, stainless steel is used for forming the members of the apparatus including the dummy plate 31, pivotal shaft 32, tank 33, dummy plate 35, endless belt 40, rollers 41 to 43, tank 44, exhaust duct 46, lid 47 and casing 48 in order to enable these members of the apparatus to exhibit a high resistance to corrosion.

The substrate processing method and apparatus of the present invention permit producing more satisfactory effects even after completion of the processing solution coating operation applied to the substrate by disposing a removing means similar to that arranged between the waiting position and the operating position.

In the embodiments described above, the substrate processing apparatus of the present invention is used for forming a liquid film on a semiconductor wafer. However, the apparatus of the present invention can also be used for forming a liquid film on an LCD substrate, for forming a liquid film on another substrate such as a CD, or for coating an electric board with a green film. Further, a polyimide series processing solution (PIQ) or a glass-containing processing solution (SOG) can be handled by the apparatus of the present invention.

Further, the substrate processing apparatus of the present invention is used singly in any of the embodiments described above. However, the apparatus of the present invention can be incorporated in a semiconductor wafer coating-developing system shown in FIG. 11.

Figure 11:
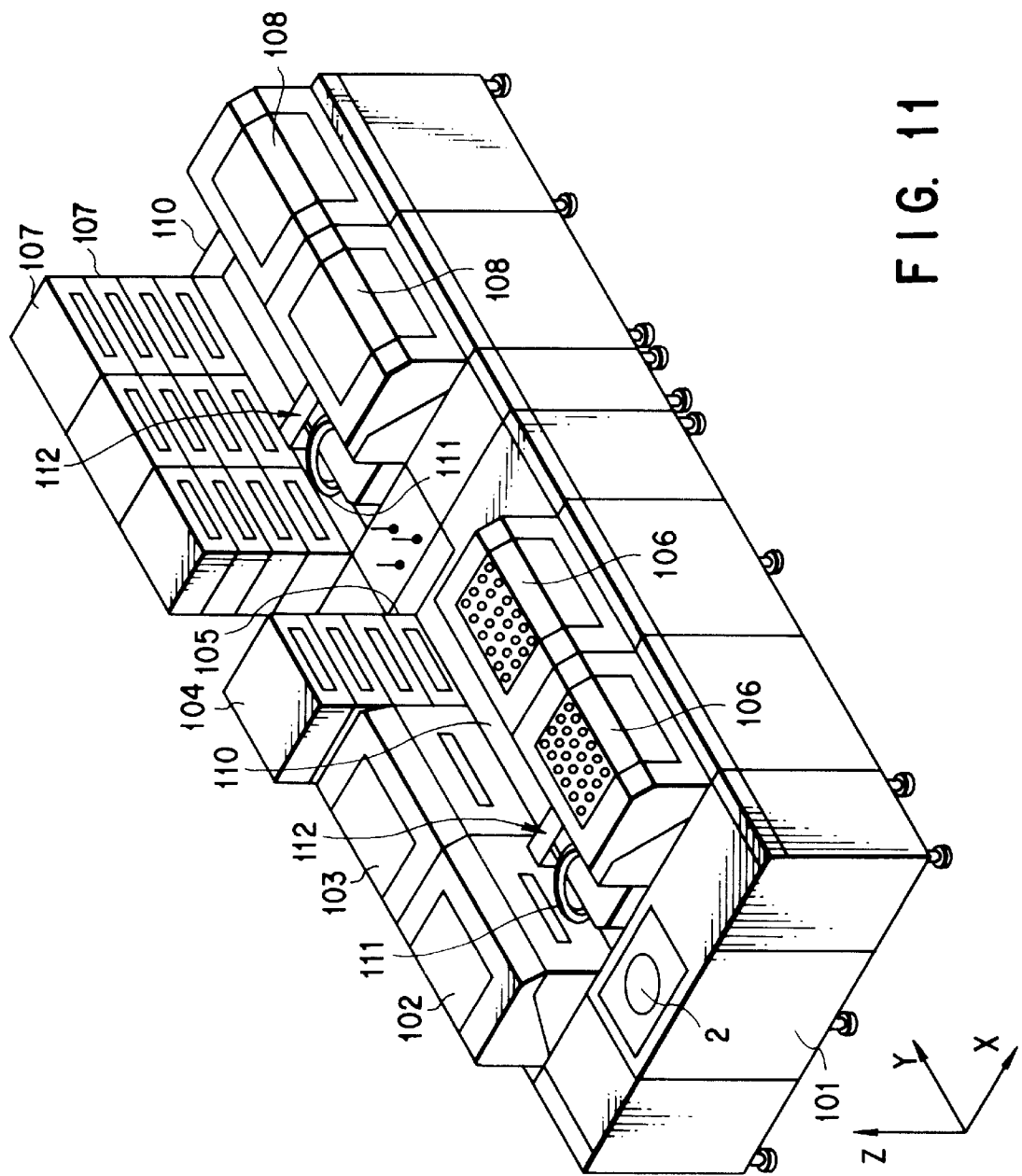
FIG. 11 is an oblique view showing a coating-developing system equipped with a substrate processing apparatus of the present invention.

The coating-developing system shown in FIG. 11 comprises a loader section 101 for loading/unloading a semiconductor wafer 2 into/out of the processing sections, a brush-washing device 102 for brush-washing the wafer 2, a jet water washing device 103 for washing the wafer 2 with a high pressure jet water, an adhesion device 104 for making the surface of the wafer 2 hydrophobic, a cooling device 105 for cooling the wafer 2 to a predetermined temperature, a resist coating apparatus 106 for coating the wafer surface with a resist solution, a heat-treating device 107 for pre-baking and post-baking the wafer 2 before and after the resist coating, respectively, a light-exposure device (not shown) for exposing each chip on the resist-coasted wafer 2 to light in a circuit pattern, and a developing apparatus 108 for applying a developing treatment to the light-exposed wafer 2 and subsequently rinsing the resist pattern after the developing step.

A wafer transfer path 110 extending in a longitudinal direction is formed in a central portion of the processing system constructed as described above. The devices 102 to 108 noted above are arranged side by side on both sides of the wafer transfer path 110 such that these devices are positioned to face the path 110. Also, a wafer transfer mechanism 112 equipped with a wafer transfer arm 111 for allowing the wafer 2 to be transferred between adjacent devices is arranged movable along the wafer transfer path 110.

In operating the system shown in FIG. 11, the wafer 2 is taken out of a cassette (not shown) arranged within the loader section 101 and, then, washed, subjected to an adhesion treatment, cooled, coated with a resist solution, has the resist removed from the peripheral portion of the wafer, is pre-baked, exposed to light, developed, post-baked and, finally, brought back into the cassette within the loader section 101.

The method and apparatus of the present invention described above produce prominent effects, as summarized below:

(1) The condition of the process solution present in the discharge port of the nozzle is sufficiently adjusted in advance in the waiting position. In addition, the adjusted condition is kept unchanged by a removing means such as a dummy plate during movement of the nozzle from the waiting position to the operating position. It follows that, where the nozzle moved to the operating position is scanned as it is over the coating surface of the substrate, the thickness of the film of the process solution formed on the substrate is made uniform over the entire region of the film, starting with the initial point of the scanning operation.

(2) An endless belt is stretched between the waiting position and the operating position. When the nozzle is in the waiting position, the process solution present in the discharge port of the nozzle is in contact with the endless belt, with the result that the condition of the process solution present in the discharge port of the nozzle is adjusted sufficiently. Also, when the nozzle is moved from the waiting position to the operating position, the nozzle is moved along that region of the endless belt which is positioned between the waiting position and the operating position. It follows that the condition of the process solution present in the discharge port of the nozzle is kept unchanged during movement of the nozzle from the waiting position to the operating position. As a result, the thickness of the process solution film formed by operating the nozzle on the substrate is rendered uniform over the entire region of the film, starting with the initial point of the scanning operation of the nozzle.

What should also be noted is that the endless belt acts both as a contact adjusting member for adjusting the condition of the process solution in the waiting position and as a removing means for maintaining the condition of the process solution adjusted in the waiting position. It follows that it is possible to decrease the number of parts used and to lower the manufacturing cost.

(3) An exhaust duct is arranged in an upper portion of a tank housing a solvent. Alternatively, a lid, which is opened and closed when the nozzle is in the waiting position and not in the waiting position, respectively, is arranged above the tank. The presence of the duct or lid permits releasing the solvent vapor within the solvent tank to the outside without fail, making it possible to prevent the properties of the coating solution from being adversely affected by the atmosphere of the solvent. Release of the solvent vapor is effective particularly in the case of using, for example, a thinner as the solvent.

(4) Compared with the conventional spin coating system, the method and apparatus of the present invention permit forming a coating film of a uniform thickness on a substrate having a large area. Also, the spin coating system gives rise to present invention permits eliminating solidification of the process solution (resist solution) at the edge portion of the substrate. However, the present invention permits eliminating the solidification problem. In addition, the present invention permits decreasing the amount of the process solution used, leading to a low manufacturing cost.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A method for processing substrates, comprising the steps of:
   (a) disposing a substrate on a supporting table such that the peripheral portion of the substrate is located in an operating position, followed by preparing a nozzle and a contact member in a waiting position apart from the substrate disposed on the supporting table and further preparing removing means in a position intermediate between said waiting position and an operating position;
   (b) adhering a solvent to said contact member in the waiting position and moving the contact member relative to said nozzle so as to bring the process solution present in the solution discharge port of the nozzle into contact with the solvent adhered to the contact member adjust the condition of the process solution present in the solution discharge port of the;
   (c) spurting the process solution from the nozzle while moving the nozzle from the waiting position to an operating position through said removing means so as to allow the process solution spurted from the nozzle to be deposited on the removing means; and
   (d) spurting the process solution from the nozzle while moving said substrate and the nozzle relative to each other so as to form a film of the process solution on the substrate.

2. The substrate processing method according to claim 1, wherein, in said step (b), the process solution present in the discharge port of the nozzle in the waiting position is brought into contact with the solvent adhered to the contact member which is a circumferential surface of a rotating roller.

3. The substrate processing method according to claim 2, wherein, in said step (c), a dummy plate bent along a locus of movement of the discharge port of the nozzle during movement of the nozzle between the waiting position and the operating position is used as said removing means.

4. The substrate processing method according to claim 2, wherein, in said step (c), a flat dummy plate extending along a locus of movement of the discharge port of the nozzle during movement of the nozzle between the waiting position and the operating position is used as said removing means.

5. A method for preparing substrates, comprising the steps of:
   (a) disposing a substrate on a supporting table such that the peripheral portion of the substrate is located in an operating position, followed by bringing a nozzle to a waiting position apart from the substrate disposed on the supporting table and further preparing an endless belt stretched between the waiting position and operating position of the nozzle such that an upper part of said belt extends along the locus of movement of the discharge port of the nozzle, and a tank housing a solvent, a lower part of said endless belt being dipped in said solvent;
   (b) adhering a solvent to said endless belt in the waiting position and moving the endless belt relative to said nozzle so as to bring the process solution present in the solution discharge port of the nozzle into contact with the solvent adhered to the endless belt;
   (c) spurting the process solution from the nozzle while moving the nozzle from the waiting position to an operating position through an upper part of the endless belt so as to spurt the process solution onto the upper part of the endless belt; and
   (d) spurting the process solution from the nozzle while moving said substrate and the nozzle relative to each other so as to form a film of the process solution on the substrate.

6. The substrate processing method according to claim 5, wherein a lid, which is opened when the nozzle is in the waiting position and is closed when the nozzle is not in the waiting position, is arranged in an upper portion of the tank.

7. An apparatus for processing substrates, comprising:
   a supporting table on which a substrate is disposed such that the peripheral portion of the substrate is located in an operating position;
   a nozzle for supplying a process solution to the substrate disposed on the supporting table;
   nozzle moving means for moving said nozzle between a waiting position apart from the substrate disposed on the supporting table and said operating position;
   a contact member having a solvent adhered thereto in said waiting position and being moved relative to the nozzle such that the process solution present in the solution discharge port of the nozzle is brought into contact with said adhered solvent so as to permit the process solution to be spurted from the nozzle; and
   removing means mounted between the waiting position and the operating position for removing the process solution present in the solution discharge port of the nozzle.

8. The substrate processing apparatus according to claim 7, wherein said contact member is a roller which is rotatable.

9. The substrate processing apparatus according to claim 8, wherein a dummy plate bent along a locus of movement of the discharge port of the nozzle during movement of the nozzle between the waiting position and the operating position is used as said removing means.

10. The substrate processing apparatus according to claim 8, wherein a flat dummy plate extending along a locus of movement of the discharge port of the nozzle during movement of the nozzle between the waiting position and the operating position is used as said removing means.

11. An apparatus for processing substrates, comprising:

an supporting table on which a substrate is disposed such that the peripheral portion of the substrate is located in an operating position;

a nozzle for supplying a process solution to the substrate disposed on the supporting table;

nozzle moving means for moving said nozzle between a waiting position apart from the substrate disposed on the supporting table and said operating position;

an endless belt stretched between the waiting position and operating position of the nozzle such that an upper part of said belt extends along the locus of movement of the discharge port of the nozzle, said endless belt being moved relative to the nozzle such that a solvent is adhered to the belt in the waiting position of the nozzle and the adhered solvent is brought into contact with the process solution present in the discharge port of the nozzle so as to permit the process solution to be discharged and, at the same time, to remove the process solution present in the discharge port of the nozzle; and a tank housing a solvent, a lower part of said endless belt being dipped in said solvent.

12. The substrate processing apparatus according to claim 11, wherein an exhaust duct is arranged in an upper portion of said tank.

13. The substrate processing apparatus according to claim 11, wherein a lid, which is opened when the nozzle is in the waiting position and is closed when the nozzle is not in the waiting position, is arranged in an upper portion of the tank.

14. The substrate processing apparatus according to claim 11, wherein said tank is arranged within a casing having an upper lid.

* * * * *